United States Patent [19]

Galpin

[11] 4,352,999
[45] Oct. 5, 1982

[54] ZERO-CROSSING COMPARATORS WITH THRESHOLD VALIDATION

[75] Inventor: Robert K. Galpin, Marlow, England

[73] Assignee: Plessey Overseas Limited, Ilford, England

[21] Appl. No.: 186,760

[22] Filed: Sep. 12, 1980

[30] Foreign Application Priority Data

Sep. 14, 1979 [GB] United Kingdom ............... 7931927

[51] Int. Cl.³ .................... H03K 5/153; G01R 19/175
[52] U.S. Cl. .................................. 307/354; 307/360; 328/146; 328/150
[58] Field of Search ............... 307/290, 354, 359, 360, 307/252 UA; 328/151, 146, 150

[56] References Cited

U.S. PATENT DOCUMENTS

| | | | |
|---|---|---|---|
| 3,348,068 | 10/1967 | Miller | 307/354 |
| 3,718,864 | 2/1973 | Kelly et al. | 307/354 |
| 4,090,144 | 5/1978 | Jenik et al. | 307/354 |
| 4,162,454 | 7/1979 | Olsen | 307/359 |

FOREIGN PATENT DOCUMENTS 1500538  2/1978  United Kingdom .

*Primary Examiner*—John Zazworsky
*Attorney, Agent, or Firm*—Fleit & Jacobson

[57] ABSTRACT

In carrier and timing recovery systems for high performance data modems it is essential to employ threshold comparators and to be able to determine accurately zero-crossing instants. The circuit of the invention comprises a comparator with feedback which produces a positive transition of the comparator output in response to the negative zero-crossing transition of the input signal on condition that the previous half-cycle of the input signal has exceeded the positive reference threshold. In a practical arrangement two comparators are provided together with a pair of bistable storage elements which produces a narrow pulse in response to the negative zero-crossing transition of an input signal provided that the input signal has exceeded the positive reference threshold applied to the second comparator.

2 Claims, 5 Drawing Figures

ZERO-CROSSING COMPARATORS WITH THRESHOLD VALIDATION

Voltage comparators and other circuits for slicing analogue signals are well known in the art and employed in many situations. In some applications where the need exists to distinguish a valid signal from low level noise, a voltage threshold may be applied to the reference input of the comparator in order that only signals exceeding that threshold voltage will cause the comparator to switch. Unfortunately when this method is used, the transition of the comparator output will be delayed with reference to the zero-crossing of the input in one direction and advanced in the other direction by an amount depending upon the amplitude of the input signal. In some applications like carrier recovery and timing recovery systems in high performance data modems it is essential to preserve accurately the zero-crossing instant of the input while providing a threshold to prevent the comparator responding to signals of less than a predetermined amplitude. It is an aim of the present invention to achieve this preservation.

According to one embodiment of the invention there is provided for use in carrier and timing recovery circuits of a digital data transmission system a zero-crossing comparator incorporating feedback which produces a transition of the comparator output in response to the zero-crossing transition of the comparator input signal on condition that the previous half-cycle of the input signal has exceeded a reference threshold.

In another embodiment of the invention two comparators are provided together with a pair of bistable storage elements which produces a narrow pulse in response to the zero-crossing transition of the input signal provided that the input signal has exceeded a reference threshold applied to the second comparator.

In order that the invention may be more readily understood reference is made to the following figures.

Figure 1:
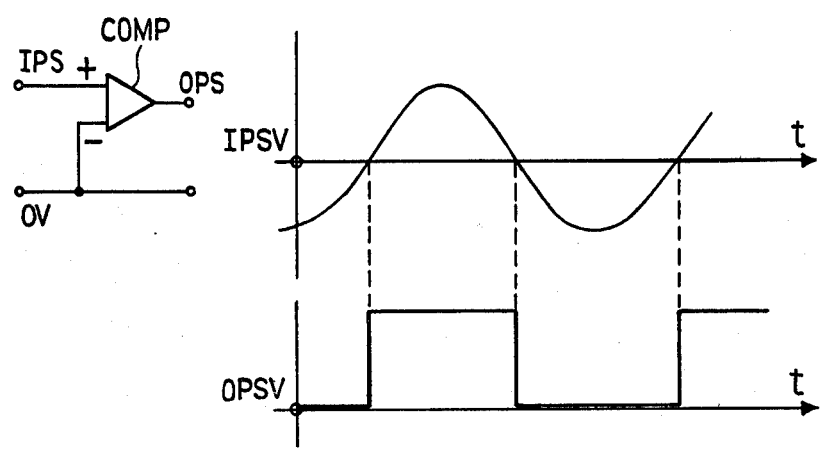
FIG. 1 illustrates the operation of a simple comparator (prior art).

In FIG. 1 (prior art) the input signal IPS is applied to the positive input of a differential amplifier comparator COMP which is biased on its negative input by a zero volt 0V condition. The waveforms shown at the side of the circuit of FIG. 1 indicate the input signal voltage IPSV and the output signal voltage OPSV as a function of time t. Each time the input signal crosses zero the comparator produces an output until the signal returns to zero again.

Figure 2:
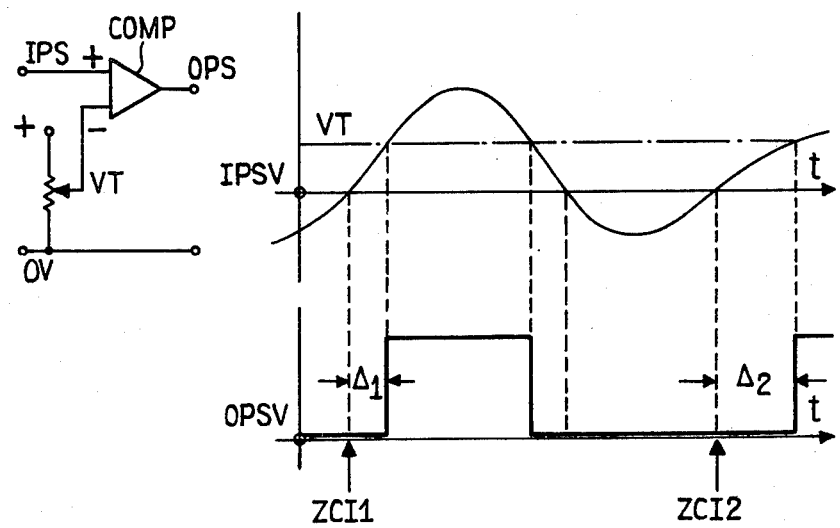
FIG. 2 illustrates the operation of a comparator with a threshold voltage (prior art).

In FIG. 2 (prior art) the same comparator COMP is provided with a variable threshold level VT which provides a pedestal above zero for the comparator. The waveforms relevant to the circuit of FIG. 2 are shown at the side of the circuit and it will be seen that the threshold voltage causes displacement of $\Delta 1$ and $\Delta 2$ to be experienced from the zero crossing instants ZCI1 and ZCI2.

Figure 3:
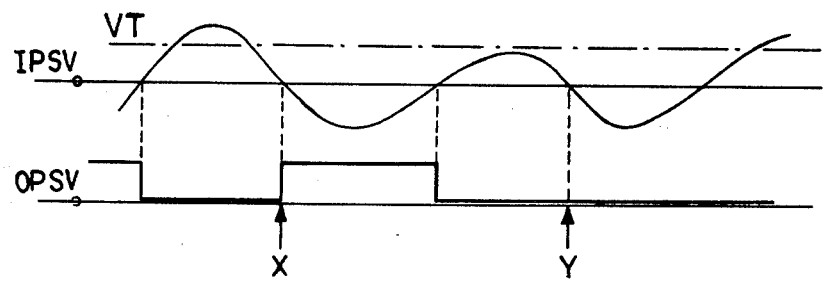
FIG. 3 illustrates the principle of amplitude validation of zero-crossing transitions.

FIG. 3 illustrates the principle of operation of the invention in that the zero transition of the input signal IPSV is amplitude validated.

Figure 4:
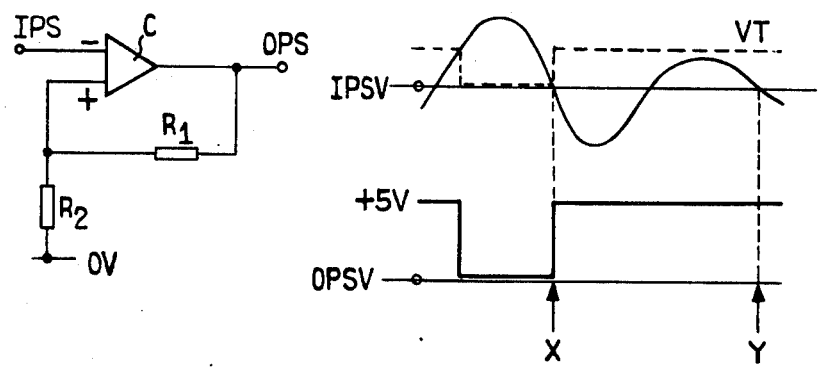
FIG. 4 illustrates one embodiment of the present invention comprising a comparator with feedback which produces a positive transition of the comparator output in response to the negative zero-crossing transition of the input signal on condition that the previous half-cycle of the input signal has exceeded the positive referenced threshold.

FIG. 4 shows a simple amplitude-validated zero-crossing comparator comprising a differential amplifier C which has a logic compatible output, a suitable device being an LM 311. The comparator C is provided with feed back through resistors R1 and R2 to its positive input with the input signal applied to its negative input. This provides a threshold voltage of $(R2)/(R1+R2)$ Vo. It will be seen that at point X a valid transmission occurs whereas at point Y an invalid transition occurs. Accordingly the output voltage OPSV produced by the circuit includes a positive going edge which occurs when the input waveform passes through zero after having exceeded the threshold level VT provided by the R1 and R2 feedback network.

Figure 5:
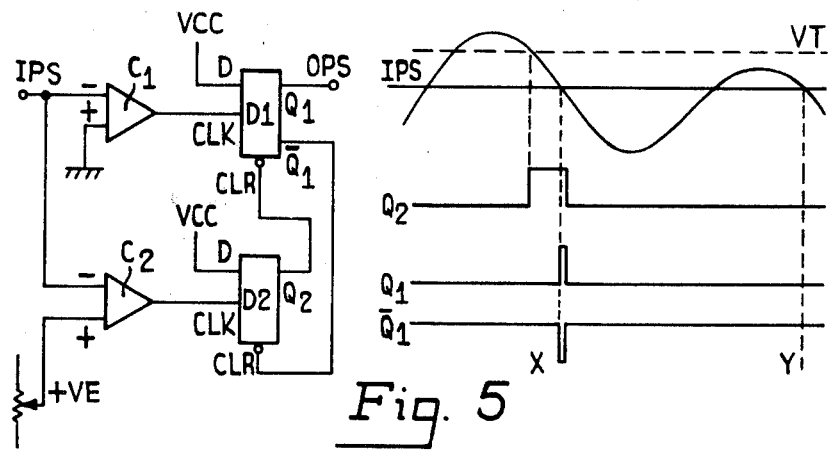
FIG. 5 illustrates a second embodiment of the present invention comprising two comparators and bistable storage elements which produces a narrow pulse in response to the negative zero-crossing transition of the input signal provided that the input signal has exceeded the positive reference threshold applied to the second comparator.

Considering now FIG. 5 a second embodiment of the invention is shown in that two differential amplifier comparators C1 and C2 are provided driving a pair of "D" type toggles D1 and D2 which are interconnected so as to generate a narrow pulse on the output lead OPS when the input lead IPS passes through zero after having exceeded the positive threshold provided by the threshold level +VT. The output signals from the comparators C1 and C2 are connected respectively to the clock inputs of the "D" type toggles while the data inputs to the "D" type toggles are held at the logic "1" state level. The Q output from toggle D2 is used to control the clear input to toggle D1 while the $\overline{Q}$ outputs from toggle D1 is used to control the clear input to toggle D2. In operation when the positive half cycle of the input signal falls below the threshold level +VT toggle D2 is set by the output from comparator C2. This causes toggle D1 to be primed on its clear input by the "1" state signal on Q2. When the input waveform IPS reaches zero comparator C1 generates an output condition to switch D1 to the "1" state. The "0" transition on $\overline{Q1}$ causes toggle D2 to be cleared which in turn switches Q2 to the "0" state thereby clearing D1. The output signal OPS, therefore, exists for the time it takes to clear toggles D2 and D1.

The above description has concentrated on circuit arrangements operating on positive signals, whereas it will be obvious to those skilled in the art how the circuits could be amended to operate on negative half cycles.

What I claim is:

1. A circuit arrangement for use in carrier and timing recovery circuits of a digital data transmission system, the circuit arrangement comprising in combination first and second differential amplifiers and first and second toggles, the first differential amplifier receiving an input signal and producing an output signal when the input signal passes through zero in a first direction, the second differential amplifier receiving the input signal and producing an output signal when the input signal falls in said first direction below a predetermined reference threshold value, the first toggle being connected to the first differential amplifier for receiving the output of the first differential amplifier, the second toggle being connected to the second differential amplifier for receiving the output of the second differential amplifier, wherein the second toggle includes enabling means connected to the first toggle for enabling the first toggle to produce a short pulse in response to the zero transmission of the input signal only when the input signal has previously exceeded the predetermined reference threshold during an immediately preceding half cycle of the input signal.

2. A circuit arrangement according to claim 1, wherein the first and second toggles are D-type toggles having a data input path, a clock input path and a reset input path, and the outputs of the differential amplifiers are connected to the clock input paths of the toggles, and wherein the enabling means comprises an output of the second toggle which is connected to the reset input path of the first toggle.

* * * * *